(12) United States Patent
McCorkle et al.

(10) Patent No.: US 7,030,663 B2
(45) Date of Patent: Apr. 18, 2006

(54) METHOD AND APPARATUS FOR GENERATING NARROW PULSE WIDTH MONOCYCLES

(75) Inventors: John W. McCorkle, Vienna, VA (US); Phuong T. Huynh, Annandale, VA (US); Agustin Ochoa, Vista, CA (US)

(73) Assignee: Freescale Semiconductor, Austin, TX (US)

( * ) Notice: Subject to any disclaimer, the term of this patent is extended or adjusted under 35 U.S.C. 154(b) by 293 days.

(21) Appl. No.: 10/233,534

(22) Filed: Sep. 4, 2002

(65) Prior Publication Data

US 2003/0076136 A1 Apr. 24, 2003

Related U.S. Application Data

(60) Provisional application No. 60/316,285, filed on Sep. 4, 2001.

(51) Int. Cl.
*H03K 3/00* (2006.01)

(52) U.S. Cl. ............... 327/108; 327/112; 327/172; 327/291

(58) Field of Classification Search ........ 327/108–112, 327/170, 172–175, 291, 423, 436, 437, 589
See application file for complete search history.

(56) References Cited

U.S. PATENT DOCUMENTS

| | | | |
|---|---|---|---|
| 3,997,843 A | 12/1976 | Wohlers | |
| 4,118,791 A | 10/1978 | Swain | 364/900 |
| 4,620,310 A | 10/1986 | Lvovsky et al. | 375/17 |
| 4,641,317 A | 2/1987 | Fullerton | |
| 4,743,906 A | 5/1988 | Fullerton | |
| 4,813,057 A | 3/1989 | Fullerton | |
| 4,979,186 A | 12/1990 | Fullerton | |
| 5,363,108 A | 11/1994 | Fullerton | |
| 5,677,927 A | 10/1997 | Fullerton et al. | |
| 5,793,262 A | 8/1998 | Kuwana et al. | 333/25 |
| 5,995,534 A | 11/1999 | Fullerton et al. | |
| 6,008,665 A * | 12/1999 | Kalb et al. | 326/30 |
| 6,031,862 A | 2/2000 | Fullerton et al. | |
| 6,091,374 A | 7/2000 | Barnes | |

(Continued)

FOREIGN PATENT DOCUMENTS

| | | |
|---|---|---|
| CA | 2168641 | 8/2000 |
| EP | 1 011 197 | 6/2000 |

OTHER PUBLICATIONS

Patent Abstracts of Japan, vol. 009, No. 118, May 23, 1985 & JP 60 009215 A (Hitachi Seisakusho KK), Jan. 18, 1985.

(Continued)

*Primary Examiner*—Kenneth B. Wells
(74) *Attorney, Agent, or Firm*—Posz Law Group, PLC (57) ABSTRACT

A monocycle forming network may include a monocycle generator, up and down pulse generators, data modulators and clock generation circuits. The network may generate monocycle pulses having very narrow pulse widths, approximately 80 picoseconds peak to peak. The monocycles may be modulated to carry data in ultra-wideband communication systems.

11 Claims, 7 Drawing Sheets

U.S. PATENT DOCUMENTS 6,133,876 A    10/2000   Fullerton et al.
6,177,903 B1    1/2001   Fullerton et al.

OTHER PUBLICATIONS

Shih C-C et al: *10 Mb/S twisted pair CMOS transceiver with transmit waveform pre-equalization*, Proceedings of the Custom Integrated Circuits Conference. San Diego, May 12-15, 1991, New York, IEEE, US, vol. Conf. 13, May 12, 1991, pp. 73-1-73-4.

Patent Abstracts of Japan, vol. 014, No. 344, Jul. 25, 1990 & JP 02 116214 A (Hitachi Shonan Denshi Co LTD), Apr. 27, 1990.

Patent Abstracts of Japan, vol. 012, No. 278, Aug.1, 1988 & JP 63 058279 A (Komatsu LTD), Mar. 14, 1988.

CD ROM copy of the entire "Specification of the Bluetooth System", with the hard copy of the relevant pages of this reference.

* cited by examiner

METHOD AND APPARATUS FOR GENERATING NARROW PULSE WIDTH MONOCYCLES

RELATED APPLICATION

This application benefits from the priority of a provisional application Ser. No. 60/316,285, filed Sep. 4, 2001 and entitled "Monocycle Generator," the disclosure of which is incorporated herein.

BACKGROUND

The present invention relates to circuits for use in an ultra-wideband communication system.

Monocycle pulses have applications in a variety of engineering disciplines. They have been proposed for use in ultra-wideband communications applications because they spread signal energy over frequency and time and may be modulated to carry information. In synchronous oscillators, monocycles may simplify designs of such oscillators and lower the frequency of driving clocks thereto. Monocycles are also used in radar applications to measure environmental impulse reflections.

Almost uniformly, it is desirable to generate monocycles having the shortest duration possible. To extend useful battery life when deployed in mobile hardware, it is desirable to generate the monocycles with low power consumption. Additionally, it is desirable to generate monocycles using circuitry that operates uniformly even when fabricated into integrated circuits from variable manufacturing processes and when operated over a variety of temperatures. The inventors are unaware of any circuits or systems that adequately harmonize these design interests.

Accordingly, with the current invention, monocycle generating circuits and systems are provided that generate monocycles having short widths, the circuits and systems consuming low power, using a reduced number of components and operating at high speed.

DETAILED DESCRIPTION

Embodiments of the present invention provide a monocycle forming network for ultra-wideband transmission. The network may include a monocycle generator, up and down pulse generators, data modulators and clock generation and timing circuits.

Figure 1A:
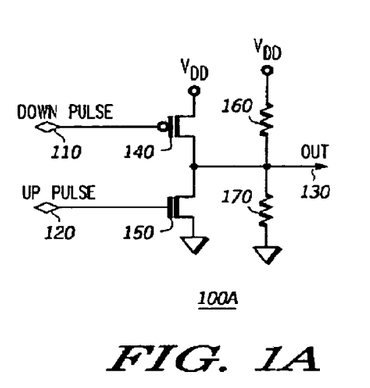
FIGS. 1A and 1B illustrate monocycle generators according to embodiments of the present invention.
Figure 1B:
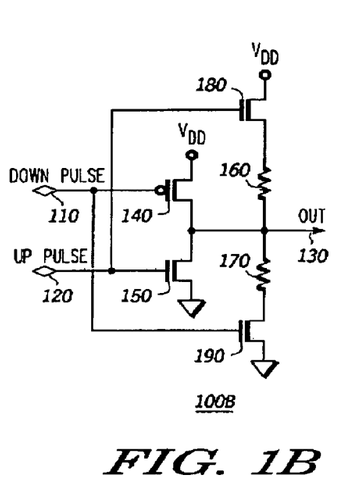

FIGS. 1A and 1B are circuit diagrams of a monocycle generators 100A and 100B according to embodiments of the present invention. The monocycle generators 100A arid 100B may each include a pair of input terminals 110, 120 for respective "down pulse" signals and "up pulse" signals. The circuits 100A and 100B may also include an output terminal 130 for the monocycle pulse to be generated by the circuits 100a and 100b.

The monocycle generators 100A and 100B may include a first transistor 140 coupling the output terminal 130 to a first voltage source ($V_{dd}$) and a second transistor 150 coupling the output terminal 130 to a second voltage source (ground). The first transistor 140 may be controlled by the down pulse signal, becoming conductive when the down pulse signal is active (low). The second transistor 150 may be controlled by the up pulse signal, becoming conductive when the up pulse signal is active (high). In this regard, the monocycle generators 100A and 100B cause the output terminal to charge toward $V_{dd}$ under the influence of the down pulse signal and to discharge toward ground under the influence of the up pulse signal.

The monocycle generators 100A and 100B may each include a voltage divider formed by a pair of resistors 160, 170. The resistors 160, 170 may couple the output terminal 130 to $V_{dd}$ and to ground respectively. During periods where the first and second transistors 140, 150 are non-conductive, a potential drop across the resistors 160, 170 may place the output terminal 130 at an intermediate potential (say, ½ $V_{dd}$, when the resistors have the same impedance).

Figure 2:
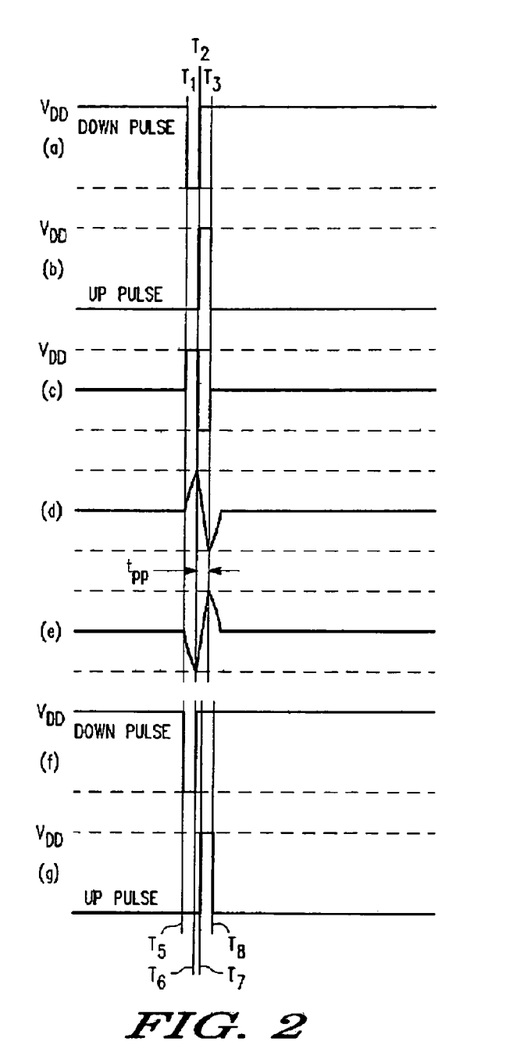
FIG. 2 illustrates input and output signals associated with a monocycle generator.

FIG. 2 is a simplified diagram illustrating operation of the monoeycle generator 100A, 100B of FIGS. 1A and 1B under the influence of idealized up pulse and down pulse signals. FIG. 2(a) illustrates a down pulse applied to the monocycle generator 100A, 100B at time $T_1$ and removed at time $T_2$. FIG. 2(b) illustrates an up pulse applied to the circuit at time $T_2$ and removed at time $T_3$. FIG. 2(c) illustrates response of the output terminal 130 under inputs illustrated in FIGS. 2(a) and (b).

Prior to activation of the down pulse at time $T_1$, the potential at the output terminal 130 is determined by the voltage divider formed by the resistors 160, 170. It may be maintained at ½ $V_{dd}$. When the down pulse is applied at time $T_1$, the transistor 140 becomes conductive, driving the potential of the output terminal 130 toward $V_{dd}$. The potential of the output terminal 130 is maintained at $V_{dd}$ until time $T_2$ when the down pulse concludes and the up pulse begins. At time $T_2$, the first transistor 140 becomes non-conductive but the second transistor 150 becomes conductive. The output terminal 130 may discharge toward ground and be maintained at ground until the up pulse concludes at time $T_3$. Thereafter, both transistors 140, 150 become non-conductive and the output terminal 130 may return to the intermediate potential under influence of the voltage divider 160, 170.

The foregoing discussion of FIGS. 2(a)–(c) present an idealized circuit response that ignores switching times of the transistors 140,150 and other sources of impedance. While such diagrams are useful to explain the circuit response to the reader, these sources of impedance may cause the circuit response to deviate from the response illustrated in FIG. 2(c).

Simulations suggest that, under real conditions, the circuit's response may correspond more closely to the waveform illustrated in FIG. 2(d).

Additionally, so as to minimize contention between the first and second transistors, a slight delay may be provided between the termination of a down pulse and the onset of a low pulse. FIGS. 2(f) and (g), therefore, illustrate a down pulse extending from time $T_5$ to $T_6$ and an up pulse beginning some time $T_7$ thereafter and concluding at time $T_8$. The timing relationships shown in FIGS. 2(f) and (g) may be employed in an embodiment of the present invention.

As shown in FIG. 1B, the monocycle generator 100B includes third and fourth transistors 180, 190 to regulate current across the voltage divider 160, 170. When a transistor 140, 150 is rendered conductive, driving the output terminal 130 to either $V_{dd}$ or ground, current flow trough the voltage divider 160, 170 can reduce the speed at which the output terminal 130 charges or discharges. Accordingly, third and fourth transistors 180, 190 disable current flow through respective resistors 160, 170 in response to the up pulse and down pulse, each becoming non-conductive when its respective input becomes active.

In this embodiment, the third transistor 180 couples the resistor 160 to $V_{dd}$. An input of the third transistor 180 may be coupled to terminal 120 and rendered non-conductive when the up pulse becomes active. Similarly, the fourth transistor 190 couples the resistor 170 to ground.

An input of the fourth transistor 190 is coupled to terminal 110 and rendered non-conductive when the down pulse becomes active. In this regard, the third and fourth transistors 180, 190 prevent current from flowing through their respective resistors when they would interfere otherwise with the switching of the output terminal 130. By reducing current flow through the voltage divider 160, 170, the third and fourth transistors 180, 190 also conserve power consumed by the circuit 100.

The monocycle obtained from the monocycle generator 100A, 100B may be output to an antenna (not shown) or other transmission structure. According to an embodiment, the monocycle may be modulated to carry information. To carry data, the timing of the up pulse and the down pulse may be modulated. In FIG. 2, the down pulse is illustrated as preceding the up pulse. This sequence may represent the first binary value (say, 1). Alternatively, the up pulse could precede the down pulse to represent a second binary value (say, −1); In this case, the circuit response may invert the monocycle of FIG. 2(d) (Shown in FIG. 2(e)). By modulating these sequences, monocycles can be made to carry information. For example, the orientation of a monocycle many be assigned to a binary value such as 1 or 0 or, alternatively, the time between successive monocycles may be used to carry information. A variety of different signaling formats become available.

The monocycle generator 100A of FIG. 1A or the monocycle 100B of FIG. 1B may be fabricated within an integrated circuit according to any number of conventional processes, including CMOS (complimentary metal oxide semiconductor) process and BJT (bipolar junction transistor) processes with complementary PNP. In a CMOS embodiment, the first and fourth transistors 140, 190 may be provided as PMOS transistors to become conductive when the signals input thereto are low. The second and third transistors 150, 180 may be provided as NMOS transistors to become conductive when the signals input thereto are high.

Figure 3:
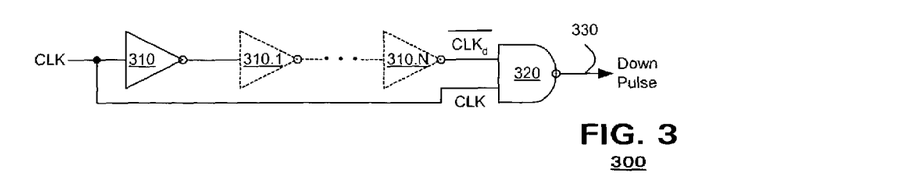
FIG. 3 illustrates a down pulse generator according to an embodiment of the present invention.

FIG. 3 illustrates a down pulse generator 300 according to an embodiment of the present invention. In this embodiment, the down pulse generator 300 may include an inverter 310 and a NAND gate 320. Inputs of the inverter 310 and the NAND gate 320 are coupled to a common clock source CLK. A second input of the NAND gate 320 is coupled to an output of the inverter 310. The NAND gate 320 may be constructed according to any of the known architectures for such gates.

As is known, an inverter 310 not only inverts an input signal but also imposes an incremental delay to the propagation of logical transitions in the input signal. Thus, the signal input to the NAND gate 320 is labeled as "$\overline{CLK_d}$" to illustrate differences in value and the relative skew between the two signals input to the NAND gate 320. In response to these two signals, the NAND gate 320 generates an output pulse that is logically high ($V_{dd}$) at all times except at the falling edge of the CLK signal. A transition in the CLK signal from low to high may cause a corresponding transition in the output of the NAND gate 320 (to ground). This down pulse may have a duration that is defined by the delay induced by elements of the inverter 310 and the NAND gate 320.

In an embodiment, the single inverter 310 actually may be provided as a cascaded chain of inverters (multiple inverters 310.1–310.N are shown in phantom), possibly including transmission gates (not shown). Thus, the delay of the $\overline{CLK_d}$ signal with respect to the source signal CLK may be tuned to fit individual applications. As described above, this delay may determine the width of the down pulse generated therefrom.

The NAND gate 320 may be provisioned according to any of the traditional circuit architectures for such gates. Many of these known architectures have charge paths and discharge paths (paths from the output terminal 330 to either $V_{dd}$ or ground) that traverse multiple switching transistors. The multiple switching transistors can determine a maximum rate at which the output terminal 130 can charge toward $V_{dd}$ or discharge toward ground. Longer switching times of the NAND gate 320 cause down pulses of longer duration which, in turn, can cause monocycles output by the pulse generator 100 (FIG. 1) to have a longer duration. In many applications, it is desirable to minimize the duration of the monocycle, often measured by the peak-to-peak transition time (shown as $t_{pp}$ in FIG. 2), and therefore a down pulse generator having a faster switching time may be used.

Figure 4:
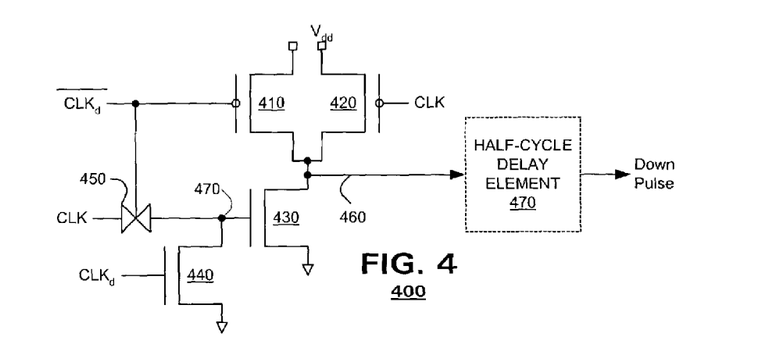
FIG. 4 illustrates a down pulse generator according to another embodiment of the present invention.

FIG. 4 is a block diagram of a down pulse generator 400 according to another embodiment of the present invention. The embodiment of FIG. 4 may include four transistors 410–440 and a transmission gate 450. First and second transistors 410, 420 may couple an output terminal 460 to $V_{dd}$. The first transistor may be controlled by a delayed inverted clock signal $\overline{CLK_d}$. The second transistor 420 may be controlled by a clock signal CLK. A third transistor 430 may couple the output terminal 460 to ground. Thus, charging paths (from the output terminal 460 to $V_{dd}$) and discharging paths (from the output terminal 460 to ground) traverse at most one switching transistor in this embodiment.

The fourth transistor 440 may bridge between ground and an input of the third transistor 430 (node 470). The fourth transistor 440 may be controlled by a delayed clock signal $CLK_d$. The gate 450 may bridge the input 470 of the third transistor 430 to a source of the clock signal CLK. The gate 450 itself may be controlled by the delayed inverted clock signal $\overline{CLK_d}$.

The down pulse generator 400 of FIG. 4 may be advantageous for use in certain applications because charging paths (from the output terminal 460 to $V_{dd}$) and discharging paths (from the output terminal 460 to ground) traverse at most one switching transistor 410, 420 or 430. Two transistors 410 and 420 are provided between the output terminal 460 and $V_{dd}$, providing independent, parallel conductive paths to $V_{dd}$. A single transistor 430 is provided between the output terminal 460 and ground. The "at most one" property of this embodiment can lead to faster charging and discharging of the output terminal 460 than would be provided by generators that employ traditional NAND gates and, therefore, can lead to a shorter peak-to-peak time ($t_{pp}$).

Figure 5:
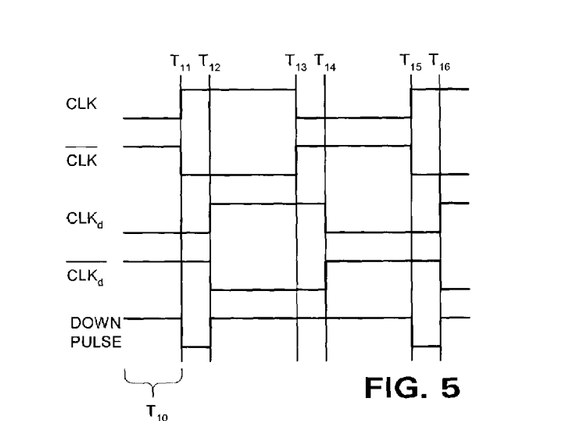
FIG. 5 illustrates exemplary clock signals that may be input to a down pulse generator.

FIG. 5 is a timing diagram illustrating exemplary clock signals CLK, $CLK_d$ and $\overline{CLK_d}$ input to the down pulse generator 400 of FIG. 4. In this embodiment, complementary clock signals CLK and $\overline{CLK}$ are provided without skew between them. Delayed clock signals $CLK_d$ and $\overline{CLK_d}$ may be delayed relative to the source clock signals CLK and $\overline{CLK}$ by some predetermined delay. Table 1 below illustrates these input clock signals and the response of the down pulse generator 400 therefrom.

TABLE 1

|  | $T_{10}$ | $T_{11}$ | $T_{12}$ | $T_{13}$ | $T_{14}$ | $T_{15}$ | $T_{16}$ |
| --- | --- | --- | --- | --- | --- | --- | --- |
| CLK | Low | High | High | Low | Low | High | High |
| $\overline{CLK}$ | High | Low | Low | High | High | Low | Low |
| $CLK_d$ | Low | Low | High | High | Low | Low | High |
| $\overline{CLK_d}$ | High | High | Low | Low | High | High | Low |
| Transistor 410 | Off | Off | On | On | Off | Off | On |
| Transistor 420 | On | Off | Off | On | On | Off | Off |
| Transistor 440 | Off | Off | On | On | Off | Off | On |
| Gate 450 | Open | Open | Shut | Shut | Open | Open | Shut |
| Node 470 | Low | High | Low | Low | Low | High | Low |
| Transistor 430 | Off | On | Off | Off | Off | On | Off |
| Output 460 | High | Low | High | High | High | Low | High |

During the period defined by $T_{10}$, the output terminal 460 is driven to $V_{dd}$ under the influence of transistor 420. The transistor 430 is non-conductive under the influence of the CLK signal that is passed by the open gate 450. Thereafter, the clock signals CLK and $\overline{CLK}$ change state.

At time $T_{11}$, transistor 420 becomes non-conductive and the transistor 430 becomes conductive, both under the influence of the CLK signal. The transistor 420 no longer pulls the output terminal high. Instead, under influence of the conducting transistor 430, the output terminal 460 is driven toward ground. The switching speed of transistor 430 should be fast because the transistor 440 is fully non-conductive and the gate 450 is fully open. The down pulse begins.

At time $T_{12}$, the delayed clock signals $CLK_d$ and $\overline{CLK_d}$ change state. The gate 450 may close under the influence of the $\overline{CLK_d}$ signal, cutting off the transistor input 470 from the $CLK_d$ signal. Also, the fourth transistor 440 becomes conductive under the influence of the $CLK_d$ signal, pulling the input terminal 470 of the third transistor 430 toward ground. The third transistor 430 becomes non-conductive, thereby releasing the driving effect formerly applied to the output terminal 460. Additionally, the first transistor 410 becomes conductive under the influence of the $\overline{CLK_d}$ signal. Thus, the output terminal 460 is driven to $V_{dd}$ via the conductive path established by the first transistor 410. The active state of the down pulse may conclude.

At time $T_{13}$, the CLK and $\overline{CLK}$ clocks change state. The second transistor 420 becomes conductive. The output terminal 460 continues to be maintained at $V_{dd}$, this time under the influence of the first and second transistors 410 and 420.

At time $T_{14}$, the $CLK_d$ and $\overline{CLK_d}$ clock signals change state. The gate 450 opens and the fourth transistor 440 ceases to conduct. However, because the CLK signal is low, the response of the third transistor 430 need not change. The charging path between the output terminal 460 and $V_{dd}$ through first transistor 410 ceases because the first transistor 410 becomes non-conductive. However, the output terminal 460 continues to be maintained at $V_{dd}$ under the influence of the charging path established by the second transistor 420, which remains conductive under the influence of the CLK signal.

Thereafter, the clock cycles repeat. The circuit response at times $T_{15}$ and $T_{16}$ are the same as the circuit response at times $T_{11}$ and $T_{12}$. The down pulse output from the down pulse generator 400 transitions low momentarily but returns to a high level thereafter. As can be seen, the width of the down pulse signal may be determined by the relative delay between the edges of the CLK/$\overline{CLK}$ clocks and the edges of the $CLK_d$/$\overline{CLK_d}$ clocks.

In an alternate embodiment, the circuit structure of FIG. 4 may be employed as an up pulse generator. In this embodiment, transistors 410 and 420 may couple the output terminal 460 to $V_{dd}$ rather than ground as claimed. Similarly, sources of the transistors 430 and 440 may be coupled to ground rather than $V_{dd}$ as shown. All other circuit connections may remain unchanged. In this embodiment, the output terminal 460 is maintained at ground at all times except the period between times $T_{11}$ and $T_{12}$, when it charges toward $V_{dd}$.

As with the monocycle generator, the down pulse generators may be fabricated in an integrated circuit using any of a number of conventional processes, including CMOS and BJT processes with complementary PNP. In a CMOS embodiment, the first and second transistors 410, 420 in the embodiment of FIG. 4 may be provided as PMOS transistors, becoming conductive when input signals are at a low logical level. The third and fourth transistors 430, 440 may be provided as NMOS transistors, becoming conductive when input signals are at a high logical level.

Figure 6:
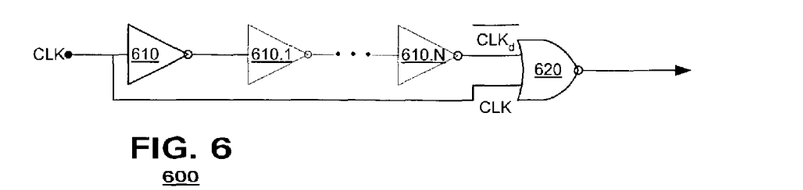
FIG. 6 illustrates an up pulse generator according to an embodiment of the present invention.

FIG. 6 illustrates an up pulse generator 600 according to an embodiment of the present invention. The up pulse generator 600 may include an inverter 610 and a NOR gate 620. The inverter 610 and the NOR gate 620 each may be coupled to a source clock signal CLK. A second input of the NOR gate 620 may be coupled to an output of the inverter 610. The up pulse generator 600 generates an output at ground except for a transition toward $V_{dd}$ that may occur once per clock cycle.

As noted, the inverter buffer 610 typically imposes a propagation delay upon an input clock signal. Thus, the signal input to the NOR gate 620 is a delayed inverted signal (labeled "$\overline{CLK_d}$") with respect to the source signal CLK. In response to these two signals, the NOR gate 620 generates an up pulse that is logically low at all times except at the falling edge of the CLK signal. A transition in the CLK signal from high to low may cause a corresponding transition in the output of the NOR gate 620 (to high). This up pulse may have a duration that is defined by the delay induced by the inverter 610 and the NOR gate 620.

In an embodiment, the single inverter 610 actually may be provided as a cascaded chain of inverters (multiple inverters 610.1–610.N are shown in phantom). Thus, the delay of the $\overline{CLK}_d$ signal with respect to the source signal CLK may be tuned as desired.

The NOR gate may be provisioned according to any of the known architectures for such gates. Many of these known architectures have charge paths and discharge paths (paths from the output terminal to either $V_{dd}$ or ground) that traverse multiple switching transistors. The multiple switching transistors can determine a maximum rate at which the monocycle can charge toward $V_{dd}$ or discharge toward ground. Again, because it is desirable in many applications to minimize the peak-to-peak time of the monocycle, faster up pulse generators may be desirable.

Figure 7:
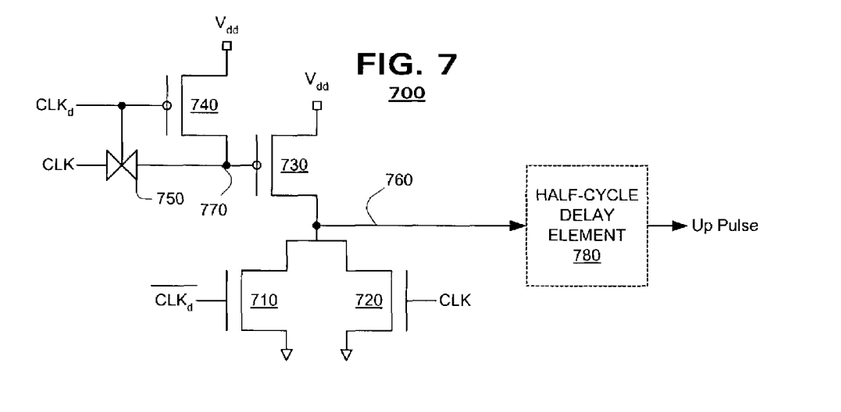
FIG. 7 illustrates an up pulse generator according to an embodiment of the present invention.

FIG. 7 is a circuit diagram of an up pulse generator 700 according to an embodiment of the present invention. The embodiment of FIG. 7 may include four transistors 710–740 and a transmission gate 750. First and second transistors 710, 720 may couple an output terminal 760 to ground. The first transistor 710 may be controlled by a delayed inverted clock signal $\overline{CLK}_d$. The second transistor 720 may be controlled by the clock signal CLK. A third transistor 730 may bridge the output terminal 760 to $V_{dd}$. Thus, charging paths (from the output terminal 760 to $V_{dd}$) and discharging paths (from the output terminal 760 to ground) traverse at most one switching transistor in this embodiment.

The fourth transistor 740 may bridge between $V_{dd}$ and an input of the third transistor 730. The fourth transistor 740 may be controlled by a delayed clock signal $CLK_d$. The gate 750 may bridge the input of the third transistor 730 to a source of the clock signal CLK. The gate 750 itself may be controlled by the delayed clock signal $CLK_d$.

Figure 8:
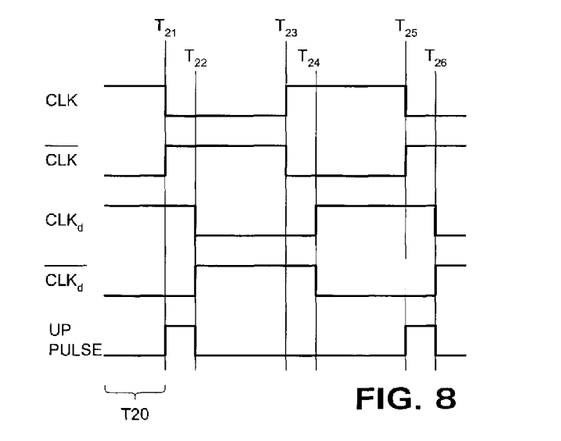
FIG. 8 illustrates exemplary clock signals that may be input to an up pulse generator.

FIG. 8 is a timing diagram illustrating exemplary clock signals CLK, $CLK_d$ and $\overline{CLK}_d$ that may be input to the down pulse generator 700 of FIG. 7. Table 2 below illustrates the response of the circuit 700 from the input clock signals shown.

TABLE 2

|  | $T_{20}$ | $T_{21}$ | $T_{22}$ | $T_{23}$ | $T_{24}$ | $T_{25}$ | $T_{26}$ |
|---|---|---|---|---|---|---|---|
| CLK | High | Low | Low | High | High | Low | Low |
| $\overline{CLK}$ | Low | High | High | Low | Low | High | High |
| $CLK_d$ | High | High | Low | Low | High | High | Low |
| $\overline{CLK}_d$ | Low | Low | High | High | Low | Low | High |
| Transistor 710 | Off | Off | On | On | Off | Off | On |
| Transistor 720 | On | Off | Off | On | On | Off | Off |
| Transistor 740 | Off | Off | On | On | Off | Off | On |
| Gate 750 | Open | Open | Shut | Shut | Open | Open | Shut |
| Node 770 | High | Low | High | High | High | Low | High |
| Transistor 730 | Off | On | Off | Off | Off | On | Off |
| Output 760 | Low | High | Low | Low | Low | High | Low |

During the period defined by $T_{20}$, the output terminal 760 is maintained at ground under the influence of the second transistor 720. The third transistor 730 is non-conductive under the influence of the CLK signal that is passed by the open gate 750.

At time $T_{21}$, the clock signals CLK and $\overline{CLK}$ change state. Transistor 720 becomes non-conductive and transistor 730 becomes conductive, both under the influence of the CLK signal. The output terminal 760 may charge toward $V_{dd}$. The up pulse begins.

At time $T_{22}$, the clock signals $CLK_d$ and $\overline{CLK}_d$ change state. The changing state of $CLK_d$ causes the gate 750 to close, thereby cutting off the transistor input 770 from the CLK source. The $CLK_d$ signal also causes the fourth transistor 740 to become conductive, thereby driving the input of the third transistor 730 toward $V_{dd}$. This renders the third transistor 730 non-conductive. Also at this time, the $\overline{CLK}_d$ signal renders the first transistor 710 conductive. The first transistor 710 drives the output terminal 760 toward ground and terminates the up pulse.

At time $T_{23}$, the clock signals CLK and $\overline{CLK}$ change state again. The second transistor 720 becomes conductive, establishing a second independent discharging path between the output terminal 760 and ground. At time $T_{24}$, when the clock signals $CLK_d$ and $\overline{CLK}_d$ change state, the $CLK_d$ signal opens gate 750 and renders the fourth transistor 740 non-conductive. Although the gate 750 open and passes the CLK signal to the transistor input 770, the CLK signal does not cause the third transistor 730 to become conductive. Under the $\overline{CLK}_d$ signal, the first transistor 710 ceases to be conductive. The discharging path of the second transistor 720, however, is not disturbed.

At times $T_{25}$ and $T_{26}$, the pattern repeats. The inputs shown at time $T_{25}$ duplicate those of time $T_{21}$. Another up pulse begins. The inputs at time $T_{26}$ duplicate those of time $T_{22}$. The up pulse concludes. Thus, the up pulse generator 700 generates an up pulse in each clock cycle having a duration determined by the relative delays between the $CLK/\overline{CLK}$ clocks and the $CLK_d/\overline{CLK}_d$ clocks.

In an alternate embodiment, the circuit structure of FIG. 7 may be employed as a down pulse generator. In this embodiment, transistors 710 and 720 may couple the output terminal 760 to ground rather than $V_{dd}$ as shown. Similarly, sources of the transistors 730 and 740 may be coupled to $V_{dd}$ rather than ground as shown. All other circuit connections may remain unchanged. In this embodiment, the output terminal 760 is maintained at $V_{dd}$ at all times except the period between times $T_{11}$ and $T_{12}$, when it charges toward ground.

The signals shown in FIGS. 5 and 8 are idealized representations. Depending upon switching times of the transistors and relative skew between the CLK/$\overline{CLK}$ clocks and the $CLK_d/\overline{CLK}_d$ clocks, the signals used in an actual circuit may deviate from the representations shown in the figures. Such deviations are entirely consistent with the purpose and intent of the present inventions.

As with the monocycle generator, the up pulse generators may be fabricated in an integrated circuit using any of a number of conventional processes, including CMOS processes and BJT processes with complementary PNP. In a CMOS embodiment, the first and second transistors 710, 720 in the embodiment of FIG. 7 may be provided as NMOS transistors, becoming conductive when input signals are at a high logical level. The third and fourth transistors 730, 740 may be provided as PMOS transistors, becoming conductive when input signals are at a low logical level.

Figure 9:
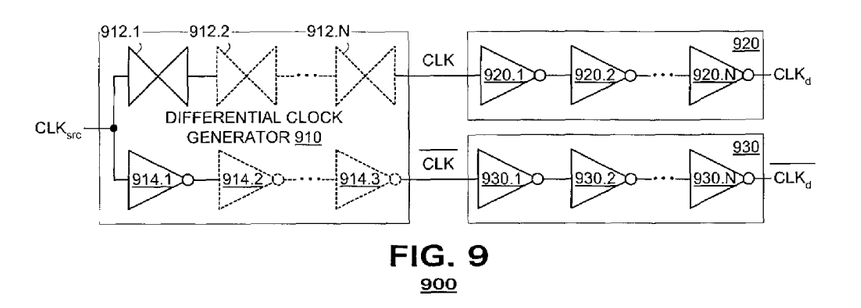
FIG. 9 illustrates a system for generating clock signals according to an embodiment of the present invention.

FIG. 9 illustrates a system 900 for generating the CLK, $\overline{CLK}$, $CLK_d$ and $\overline{CLK}_d$ clocks signals from a source clock $CLK_{src}$ according to an embodiment of the present invention. This system may include a differential clock generator 910 and a pair of delay blocks 920, 930. The differential clock generator 910 may include a transmission gate 912.1 and an inverter 914.1, each coupled to the source clock $CLK_{src}$. The inverter 914.1, as its name implies, inverts the source clock $CLK_{src}$ and generates a $\overline{CLK}$ signal. The transmission gate 912.1 propagates the source clock $CLK_{src}$ without a change in state. In an alternate embodiment, rather than provide a single inverter 914.1 and a single transmission gate 912.1, the differential clock generator 910 may include multiple transmission gates 912.1–912.N and inverters 914.1–914.N.

As explained above, a typical inverter 914.1 not only inverts the state of an input signal but it also incrementally delays propagation of the signal. Thus, edges of the $\overline{\text{CLK}}$ signal may be expected to be delayed incrementally with respect to the source clock $\text{CLK}_{src}$. Typical transmission gates 912.1 also incrementally delay input signals even though they do not change state. Thus, provided there are an equal number of transmission gates 912.1–912.N and inverters 914.1–914.N, there should be substantially no skew between the CLK and $\overline{\text{CLK}}$ clocks. In an alternate embodiment, transmission gates may be provided for all but one inverter 914.1–914.N.

The delay blocks 920, 930, in an embodiment, each may be populated by a cascaded series of inverters 920.1–920.M, 930.1–930.M. In an embodiment, the number of inverters and sizing of transistors within the inverters 920.1–920.M, 930.1–930.M may provisioned similarly between the two delay blocks 920, 930 so as to minimize skew between the $\text{CLK}_d$ and $\overline{\text{CLK}_d}$ outputs. In an embodiment where an even number of inverters are provided in the delay blocks 920, 930, the $\text{CLK}_d$ clock may be derived from the CLK input clock and the $\overline{\text{CLK}_d}$ clock may be derived from the $\overline{\text{CLK}}$ clock. Alternatively, in an embodiment where an odd number of inverters are provided in the delay blocks 920, 930, the $\text{CLK}_d$ clock may be derived from the $\overline{\text{CLK}}$ clock and the $\overline{\text{CLK}_d}$ clock may be derived from the CLK clock. The number of inverters and their sizing may be tuned to meet individual design applications for which the up pulse generators and down pulse generators are to be used.

The foregoing embodiments of up pulse generators and down pulse generators, if operative from the same clock signals, generate up pulses and down pulses that are separated by half a clock cycle. For example, as shown in FIG. 5, the downpulse is synchronized to the rising edge of the CLK signal but, as shown in FIG. 8, the up pulse is synchronized to the falling edge of the same CLK signal. In an embodiment, it may be desirable to synchronize up pulses and down pulses to the same event.

In one embodiment, to synchronize the pulses, it is sufficient to reverse the polarities of all clocking inputs to one of the pulse generators except the control input of the transmission gate. With reference to FIG. 7, for example, the $\overline{\text{CLK}}$ signal may be input to the transistor 720 and the transmission gate 750, the $\text{CLK}_d$ signal may be input to the transistor 710 and the $\overline{\text{CLK}_d}$ signal may be input to the transistor 740. The control input of the transmission gate 750 may be coupled to the $\text{CLK}_d$ input. Circuit response of this embodiment is provided below in Table 3:

TABLE 3

|  | $T_{20}$ | $T_{21}$ | $T_{22}$ | $T_{23}$ | $T_{24}$ | $T_{25}$ | $T_{26}$ |
| --- | --- | --- | --- | --- | --- | --- | --- |
| CLK | High | Low | Low | High | High | Low | Low |
| $\overline{\text{CLK}}$ | Low | High | High | Low | Low | High | High |
| $\text{CLK}_d$ | High | High | Low | Low | High | High | Low |
| $\overline{\text{CLK}_d}$ | Low | Low | High | High | Low | Low | High |
| Transistor 710 | On | On | Off | Off | On | On | Off |
| Transistor 720 | Off | On | On | Off | Off | On | On |
| Transistor 740 | On | On | Off | Off | On | On | Off |
| Gate 750 | Shut | Shut | Open | Open | Shut | Shut | Open |
| Transistor 730 | Off | Off | Off | On | Off | Off | Off |
| Node 770 | High | High | High | Low | High | High | High |
| Output 760 | Low | Low | Low | High | Low | Low | Low |

Thus, this embodiment provides an up pulse that is synchronized to the rising edge of the CLK signal. A similar inversion of inputs to the down pulse generator 400 may cause a half-cycle shift in the activation of the down pulse.

Alternatively, one of the pulse generators (the up pulse generator 700 or the down pulse generator 400) may include a delay element to impose a half-cycle delay upon the output of a respective pulse. Half-cycle delay elements 480 (FIG. 4) and 780 (FIG. 7) are shown in phantom for this purpose. A similar delay block also may be provided for the up pulse generator 600 or down pulse generator 300 of FIGS. 6 and 3.

Figure 10:
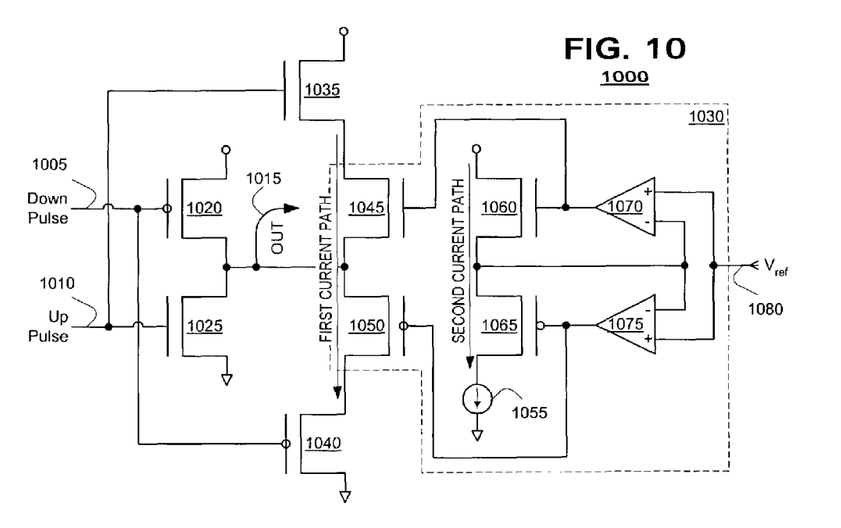
FIG. 10 illustrates another embodiment of a monocycle generator.

FIG. 10 is an embodiment of a monocycle generator 1000 according to another embodiment of the present invention. In this embodiment, the monocycle generator 1000 may include a pair of input terminals 1005, 1010 for respective down pulse and up pulse inputs and an output terminal 1015 for the monocycle pulse. The monocycle generator 1000 may include a first pair of transistors 1020, 1025 bridging the output terminal 1030 to $V_{dd}$ and ground respectively. The first transistor 1020 may be controlled by the down pulse and the second transistor 1025 may be controlled by the up pulse. The behavior of the two transistors 1020, 1025 is similar to that of the two transistors 140, 150 from the pulse generator 100 of FIG. 1.

In this embodiment, a voltage regulator 1030 may substitute for the voltage divider of FIG. 1. The voltage regulator 1030 may reduce the amount of current flow between the second $V_{dd}$-to-ground path, the path that returns the output terminal 1015 to the intermediate potential after the monocycle is generated. The monocycle generator 1000 also may include optional cut off transistors 1035, 1040, coupling the voltage regulator 1030 to $V_{dd}$ and ground respectively. The cut off transistors 1035, 1040 may be rendered nonconductive in response to respective up pulses or down pulses in a manner similar to the transistors 180, 190 of FIG. 1.

Voltage regulators are known per se. The voltage regulator 1030 of FIG. 10 may be implemented according to any of the architectures known in the art. One such architecture is shown in FIG. 10. In this embodiment, the voltage regulator 1030 includes a pair of transistors 1045, 1050 bridging between $V_{dd}$ and ground (or, if the current cut off transistors 1035, 1040 are provided, between these current cut off transistors). The output terminal 1015 is coupled to a node between the transistors 1045, 1050. These transistors 1045, 1050 form a first current path in the voltage regulator 1030.

The voltage regulator 1030 also includes a current source 1055 and second pair of transistors 1060, 1065 bridging between $V_{dd}$ and ground. The current source 1055 and the transistors 1060, 1065 form a second current path in the voltage regulator 1030. Each of the second pair of transistors 1060, 1065 have an input coupled to a respective operational amplifier (colloquially, "op amp") 1070, 1075. Inputs of each of the first pair of transistors 1045, 1050 also may be coupled to one of the op amps 1070, 1075. A first input to each of the op amps 1070, 1075 is coupled to a node between the second pair of transistors 1060, 1065. A second input to the op amps 1070, 1075 is coupled to a reference potential source ($V_{ref}$) 1080. The reference potential may be set to ½ $V_{dd}$.

Operation of voltage regulators is well known and need not be repeated here. As is known, the ratio of current through the first and second current paths may be determined by relative sizes of transistors through the path. Thus, to maintain a desired current flow through the first current path, the current flow through the second current path may be regulated correspondingly. For example, using a 3-to-1 ratio between the first pair of transistors 1045, 1050 and the second pair of transistors 1060, 1065, a 100 μA current through the second pair of transistors induces a 300 μA current through the first pair of transistors 1045, 1050 (when cut off transistors 1035, 1040, if any, are conductive).

The embodiment of FIG. 10 returns the potential of the output terminal 1015 to the reference potential (½ $V_{dd}$) at transition speeds that rival the voltage divider of FIG. 1. This may occur with a current flow as low as 900 µA through the first current path and as low as 300 µA through the second current path (1200 µA total). By contrast, resistors 160, 170 in the voltage divider of FIG. 1 typically match impedances of antennae or other transmitting equipment (not shown). Their resistance may be tuned to some predetermined value (say, between 50–100 ohms each). Using a hypothetical $V_{dd}$ of 1.8 volts, current flow through the voltage divider will be:

$$I = \frac{V}{R} = \frac{1.8 \text{ V}}{200 \text{ }\Omega} = 9000 \text{ µA}$$

Thus, the voltage regulator 1030 can yield significant current conservation over the embodiment of FIG. 1.

Figure 11:
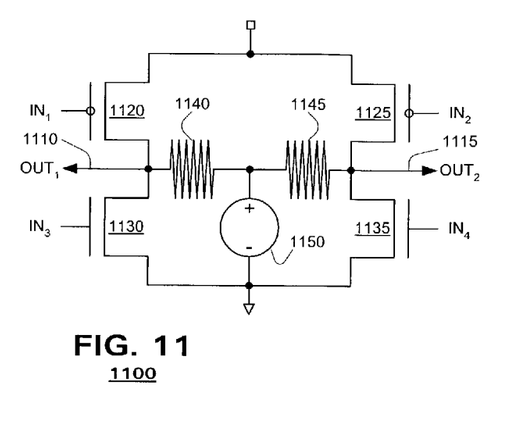
FIG. 11 illustrates another embodiment of a monocycle generator.

FIG. 11 illustrates another embodiment of a monocycle generator 1100, one that generates a pair of monocycle pulses at a pair of differential output terminals 1110, 1115. This embodiment yields monocycle pulses having twice the output voltage as in the foregoing embodiments. It also eliminates current drain from $V_{dd}$ to ground when the monocycle generator is inactive (when the output of the generator is maintained at ½ $V_{dd}$).

The monocycle generator 1100 may include a pair of pull up transistors 1120, 1125, each coupling a respective output terminal 1110, 1115 to $V_{dd}$. The monocycle generator 1100 also may include a pair of pull down transistors 1130, 1135, each coupling a respective output terminal 1110, 1115 to ground. The pull up transistors 1120, 1125 each may be controlled by respective down pulses at their inputs. The pull down transistors 1130, 1135 may be controlled by respective up pulses at their inputs.

The monocycle generator 1100 also may include a voltage divider network, populated by a pair of resistors 1140, 1145 may bridge between the output terminals 1110, 1115. A reference voltage source 1150 may maintain a node between the two resistors 1140, 1145 at a reference potential (say, ½ $V_{dd}$).

Figure 12:
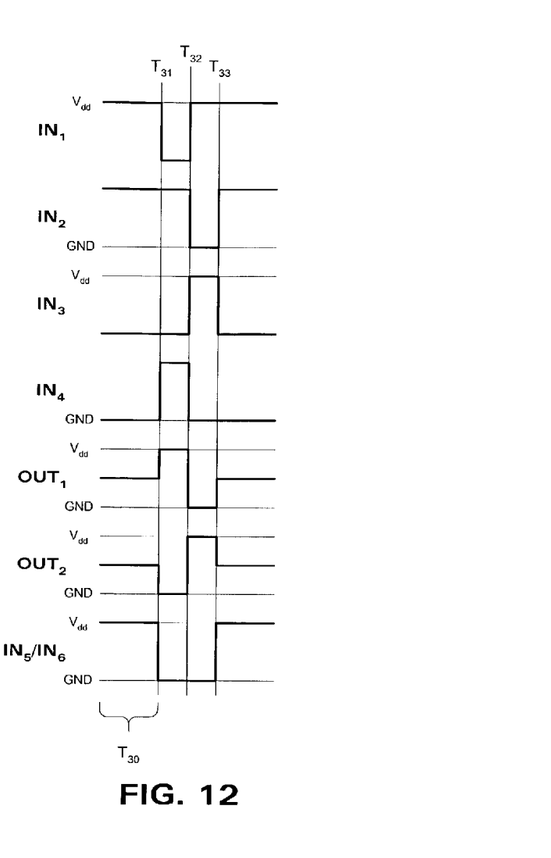
FIG. 12 illustrates input and output signals associated with a monocycle generator.

FIG. 12 illustrates response of the monocycle generator 1100 in response to exemplary input signals at the four transistors. Throughout a period labeled $T_{30}$, input signals to the four transistors maintain all the transistors in a non-conductive state. The reference voltage source 1150 maintains the potential of both output terminals 1110, 1115 at the reference potential (½ $V_{dd}$). At time $T_{31}$, a down pulse is input to the first pull up transistor 1120 and an up pulse is input to the second pull down transistor 1135. Both become conductive in response to these signals. Thus the first output terminal 1110 charges toward $V_{dd}$ and the second output terminal discharges toward ground. The transistors 1120, 1135 remain conductive until time $T_{32}$ when the activation pulses to the transistors 1120, 1135 terminate.

At time $T_{32}$, new activation pulses are applied to the second pull up transistor 1125 and the first pull down transistor 1130. They become conductive. Thus, the first output terminal 1110, which had been charged to $V_{dd}$ by the first pull up transistor 1110, discharges to ground via the first pull down transistor 1130. Similarly, the second output terminal 1115, which had discharged to ground via transistor 1135, charges to $V_{dd}$ via the second pull up transistor 1125.

The transistors 1125, 1130 may remain conductive until time $T_{33}$ when the activation pulses to transistors 1125, 1130 terminate.

After time $T_{33}$, when the four transistors cease to conduct, the two output terminals return to the intermediate potential under the influence of the reference voltage source 1150.

FIG. 12 illustrates operation of the monocycle generator 1100 in response to a single set of activation pulses. Of course, activation pulses may be applied to transistors 1125, 1130 first and to transistors 1120, 1135 thereafter. In this event, the orientation of the monocycles shown in FIG. 12 would be inverted. As in the prior embodiment, the monocycle pulses may be made to carry information by varying their orientation.

As in the prior embodiments, the monocycle generator 1100 may be fabricated in an integrated circuit using any of a number of conventional processes, including CMOS processes and BJT processes with complementary PNP. In a CMOS embodiment, the pull up transistors 1110, 1115 may be provided as PMOS transistors, becoming conductive when input signals are at a low logical level. The pull down transistors 1120, 1125 may be provided as NMOS transistors, becoming conductive when inputs signals are at a high logical level.

Figure 13:
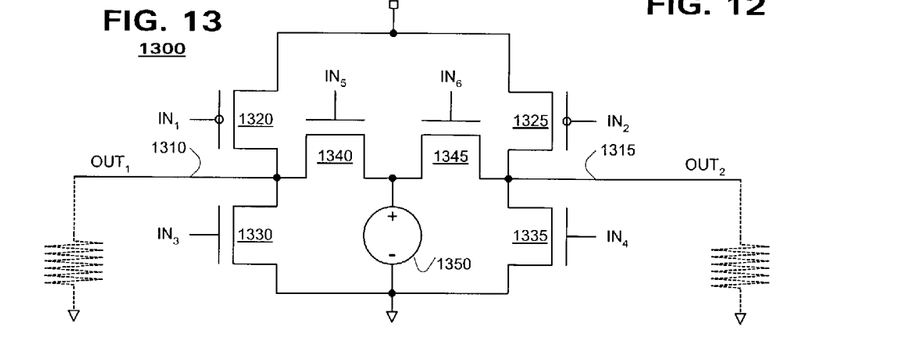
FIG. 13 illustrates another embodiment of a monocycle generator.

FIG. 13 illustrates another embodiment of a monocycle generator 1300. This embodiment also generates a differential pair of monocycles on output terminals 1310, 1315 at twice the output voltage as in the embodiment of FIG. 1. Additionally, the monocycle generator 1300 eliminates current flow from $V_{dd}$ to ground when the monocycle generator 1300 is inactive, when the output terminals each are maintained at the intermediate potential.

The monocycle generator 1300 may include a pair of pull up transistors 1320, 1325, each coupling a respective output terminal 1310, 1315 to $V_{dd}$. The monocycle generator 1300 also may include a pair of pull down transistors 1330, 1335, each coupling a respective output terminal 1310, 1315 to ground. The pull up transistors 1320, 1325 each may be controlled by respective down pulses at their inputs. The pull down transistors 1330, 1335 may be controlled by respective up pulses at their inputs.

The monocycle generator 1300 also may include a voltage divider network, populated by a pair of transistor 1340, 1345, that bridges between the output terminals 1310, 1315. A reference voltage source 1350 may maintain a node between the two transistors 1340, 1345 at a reference potential (say, ½ $V_{dd}$).

The circuit response illustrated in FIG. 12 also applies to the monocycle generator of FIG. 13. FIG. 12 illustrates additional input signals $IN_5$ and $IN_6$ that may be input to the transistors 1340, 1345. These input signals $IN_5$ and $IN_6$ may maintain the bridging transistors 1340, 1345 in a conductive state at all times except the period extending from time $T_{31}$ to $T_{33}$. Thus, the bridging transistors 1340, 1345 may be non-conductive when the pull up and pull down transistors 1320–1335 are conductive and vice versa.

The embodiment of FIG. 13 may be useful in applications where it may be useful to match the impedance of the monocycle generator 1300 with other external elements such as antennae. FIG. 13 illustrates in phantom a 50 ohm antenna coupled to each of the output terminals 1310, 1315 of the monocycle generator 1300. If the monocycle generator 1100 of FIG. 11 were used in this application, the resistors 1140, 1145 also would be 50 ohms to create an impedance match with the antennae load. This sizing would cause effective loads of 25 ohms at the pull up transistors 1120, 1125 and the pull down transistors 1130, 1135, requiring these elements to be relatively larger than corresponding elements in the embodiment of FIG. 13.

The monocycle generator 1300 of FIG. 13, however, permits provision of smaller pull up and pull down transistors 1320–1335 but to have an impedance that matches the effective load at the output terminals (say, 50 ohms to match the antenna load). The bridging transistors 1340, 1345 are conductive only when the pull up and pull down transistors 1320–1335 are non-conductive. Thus, when the bridging transistors 1340, 1345 are conductive, there is an impedance match between the bridging transistors and the load. But, at other times, the pull up and pull down transistors "see" only the impedance of the load itself. Accordingly, this embodiment may find use in applications where the monocycle generator 1300 may be expected to drive an external load.

As in the prior embodiments, the monocycle generator 1300 may be fabricated in an integrated circuit using any of a number of conventional processes, including CMOS processes and BJT processes with complementary PNP. In a CMOS embodiment, the pull up transistors 1310, 1315 may be provided as PMOS transistors, becoming conductive when input signals are at a low logical level. The pull down transistors 1320, 1325 may be provided as NMOS transistors, becoming conductive when inputs signals are at a high logical level.

Figure 14:
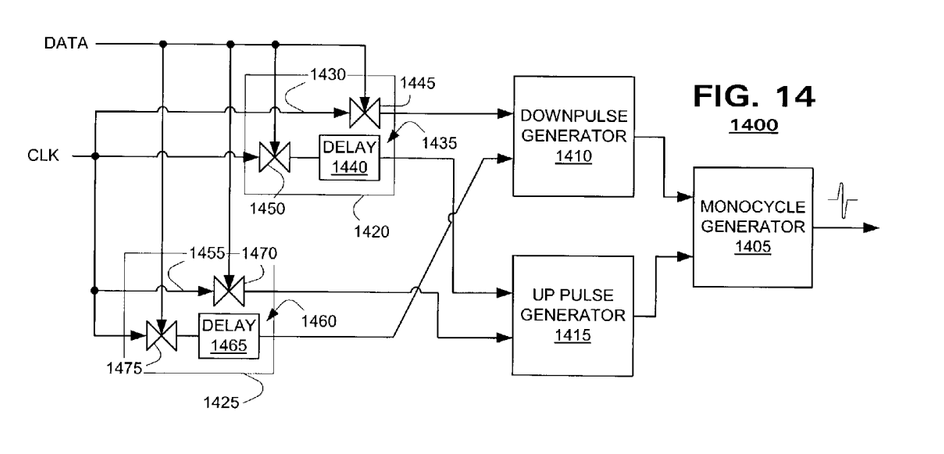
FIG. 14 illustrates a transmitter according to an embodiment of the present invention.

FIG. 14 is a block diagram of a transmitter 1400 according to an embodiment of the present invention. The transmitter 1400 may include a monocycle generator 1405, a down pulse generator 1410 and an up pulse generator 1415 as provisioned according to any of the foregoing embodiments. The transmitter 1400 also may include a pair of data modulators 1420, 1425 coupled to a clock source CLK. A first data modulator 1420 may be responsive to an input DATA signal when the signal is a first binary value (say, logical "1"), the second data modulator 1425 may be responsive to the input DATA signal when the signal is a second binary value (say, logical "0").

The first data modulator 1420 may include a fast path 1430 and a slow path 1435 for an input clock signal CLK. The slow path 1435 may include a delay block 1440 to delay propagation of the clock signal CLK with respect to the fast path 1430. Both paths 1430, 1435 may include control logic 1445, 1450 to disable propagation of the clock signal CLK unless the data signal is of a predetermined value (say, logical "1").

The second data modulator 1425 may have a structure similar to the first data modulator 1420. It may include fast and slow paths 1455, 1460, with a delay block 1465 provided along the slow path 1460. The second data modulator 1425 also may include control logic 1480, 1475 to disable propagation of the clock signal CLK unless the data signal if of a predetermined value (say, logical "0"). The control logic 1445, 1450, 1480, 1475 among the two data modulators 1420, 1425 may be provisioned in complementary fashion so that only one data modulator 1420, 1425 is responsive to each value of the data signal.

In an embodiment, the delay blocks 1440, 1465 may impose a predetermined delay upon the propagation of the clock signals. The delay blocks 1440, 1465 may be provisioned as a cascaded series of inverters. The delay characteristic of the delay blocks 1440,1465 may be tuned for the application for which the data modulators 1420,1425 are to be used.

According to an embodiment, outputs from the data modulators 1420, 1425 may be coupled to CLK inputs of the down pulse and up pulse generators 1410, 1415 in complementary fashion. The fast path from a first data modulator (say, path 1430 from modulator 1420) and the slow path from a second data modulator (say, path 1460 from modulator 1425) may be coupled to the down pulse generator 1410. The fast path 1455 from the second modulator 1425 and the slow path 1435 from the first modulator 1420 may be coupled to the CLK input of the up pulse generator 1415.

In this fashion, the data modulators 1420, 1425 may modulate the timing with clock signals are input to the down pulse and up pulse generators 1410, 1415. When the data signal is a logical "1," for example, the first data modulator 1420 is enabled. Via the fast path 1430, the clock signal CLK may propagate without delay to the down pulse generator 1410, causing a down pulse to be applied to the monocycle generator 1405. After some period of time, the clock signal CLK propagates through the delay block 1440 to the up pulse generator 1415, causing an up pulse to be applied to the monocycle generator 1405. As explained with respect to FIG. 2, the down pulse-up pulse progression may cause the monocycle generator 1405 to produce a monocycle pulse having a predetermined orientation, such as the pulse of FIG. 2(d).

When the data signal is a logical "0," however, the second data modulator 1425 may be enabled. Via its fast path 1445, the clock signal CLK may propagate without delay to the up pulse generator 1415, causing an up pulse to be applied to the monocycle generator 1405. After some period of time, the clock signal CLK propagates through the delay block 1465 to the down pulse generator 1410, causing a down pulse to be applied to the monocycle generator 1405. As explained with respect to FIG. 2, the up pulse-down pulse progression may cause the monocycle generator 1405 to produce a monocycle pulse having a predetermined orientation, such as the pulse of FIG. 2(e).

In an embodiment where the down pulse and/or up pulse generators 1410, 1415 are provided according to FIGS. 4 or 7, the transmitter 1400 may include a differential clock generator and delay blocks as shown in FIG. 9. Outputs from the data modulators 1420, 1425 would be input to respective differential clock generators. Outputs from the respective sets of differential clock generators and delay blocks would be input to the pulse generators as described above. This embodiment is not shown in FIG. 14 so as to maintain clarity of the presentation.

Figure 15:
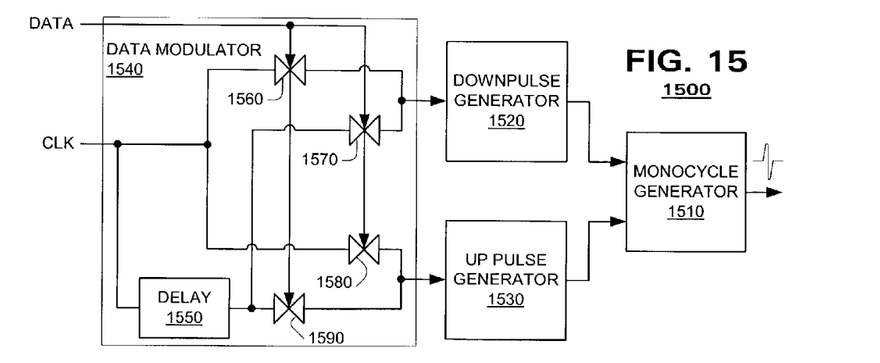
FIG. 15 illustrates a transmitter according to another embodiment of the present invention.

FIG. 15 is a block diagram of a transmitter 1500 according to another embodiment of the present invention. In this embodiment, the transmitter 1500 may include a monocycle generator 1510, a down pulse generator 1520, an up pulse generator 1530 and a single data modulator 1540. The data modulator 1540 may include a fast path and a slow path having a delay block 1550. The fast path may be coupled to the up pulse generator 1530 and down pulse generator 1520 by respective transmission gates 1560, 1570. The slow path may be coupled to the up pulse generator 1530 and down pulse generator 1520 by a second set of transmission gates 1580, 1590. The transmission gates 1560,1590 may open in response to a first state of a data signal (say, logical "1"); transmission gates 1570, 1580 may open in response to a complementary state of the data signal (logical "0").

The embodiment of FIG. 15 modulates the delivery of clock signals to the up pulse and down pulse generators 1530, 1520 in response to the state of the data signal. Accordingly, the data signal may control delivery of activation pulses to the monocycle generator 1510 and, therefore, causes the monocycles to carry digital data.

In an embodiment where the down pulse and/or up pulse generators 1530, 1520 are provided according to FIGS. 4 or 7, the transmitter 1500 may include a differential clock generator and delay blocks as shown in FIG. 9. Outputs from the data modulator 1540 would be input to respective differential clock generators. Outputs from the respective sets of differential clock generators and delay blocks would be input to the pulse generators as described above. This embodiment is not shown in FIG. 15 so as to maintain clarity of the presentation.

As shown in the embodiments of FIGS. 14 and 15, the clock signals output from the data modulators may be used as the clock signals input to the down pulse generators 1410/1520 and up pulse generators 1415/1530.

The foregoing embodiments present monocycle generators in which pull up transistors and pull down transistors, such as transistors 140, 150 of FIG. 1, have complementary device types (e.g., PMOS for one, NMOS for the other) and are responsive to respective down pulse and up pulse activation signals. The principles of the present invention, however, are not so limited. They may find application in embodiments where the pull up and pull down transistors both are of a single device type. For example, with reference to FIG. 1, the transistors 140 and 150 both could be provided as PMOS transistors to be responsive to respective down-pulse activation signals. In this embodiment, timing between the respective down pulse signals may be modulated to cause orientation of the monocycles generated therefrom to reflect digital data. Similarly, the transistors 140, 150 both could be provided as NMOS transistors and responsive to staggered up pulse activation signals whose timing is modulated to reflect information. Any of the monocycle generators presented above could be so provisioned.

Based on current process techniques, it is expected that embodiments where pull up and pull down transistors 140, 150 are provisioned as like kind device types may not perform as well as embodiments where the device types differ between the two transistors. In a CMOS implementation, for example, provision of like kind device types may cause a monocycle to exhibit asymmetry. Consider an example where the two transistors 140, 150 of FIG. 1 both are provided as NMOS transistors. The pull down transistor 150 may pull an output terminal 130 fully to ground when it is rendered conductive. However, an NMOS pull up transistor 140 may not pull the output terminal fully to $V_{dd}$. More likely, it will pull the output terminal 130 to within about ½ a volt of $V_{dd}$ but no more. Thus, a monocycle generated from this circuit would be "lopsided." The like-kind embodiments are suited for applications where asymmetrical monocycles do not affect system performance. And, of course, when new process technologies become available in which a single device can pull to ground and to $V_{dd}$ equally as well, the like-kind embodiments becomes suited for all applications.

The foregoing discussion has presented pulse generators and driving circuits therefore that build timing relationships based upon the switching responses of the transistors and other elements that populate these circuits. That the timing relationships are determined by the switching responses of these elements raises an interesting consequence for these circuit architectures—as the processes and materials used in integrated circuits improve, so will the speeds of the monocycles generated by these circuits. Currently, these circuits are foreseen for implementation in integrated circuit manufactured from a standard 0.18 μm CMOS process, yielding a 80 picosecond peak-to-peak monocycle pulse. Of course, the circuit architectures described above may be applied using a variety of transistor structures including, for example, bipolar junction transistors. Hypothetically, if the circuit architectures were applied using transistor structures that have switching speeds that double those achieved by the 0.18 μm CMOS process, the monocycle pulse duration would reduce by 50%. A shorter duration would yield improved communication efficiency. Thus, the circuit architectures may "ride along" with improvements in manufacturing processes and yield higher communications efficiencies with such improvements.

Although the circuit architectures presented above can yield a 80 picosecond monocycle pulse width, variations in manufacturing processes, variations in operating temperatures and other errata can alter this pulse width and lower performance. To minimize variations in the pulse width, it may be advantageous to control power supplied to the monocycle generator.

Figure 16:
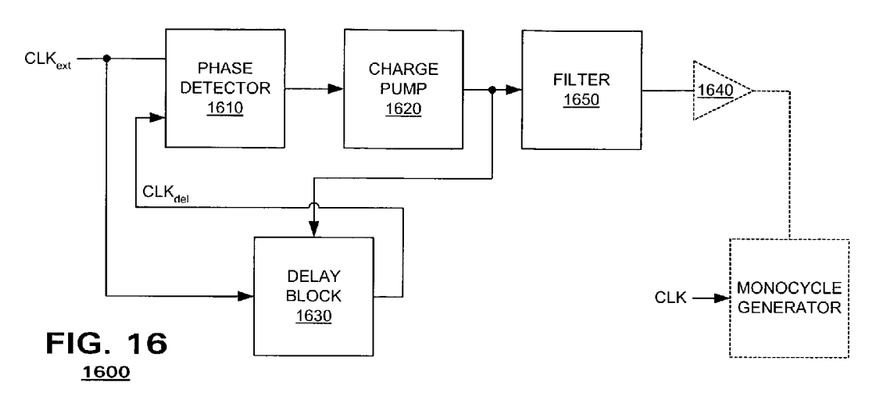
FIG. 16 illustrates a skew controller according to an embodiment of the present invention.

FIG. 16 is a block diagram of a skew controller 1600 according to an embodiment of the present invention. The skew controller 1600 may include a phase detector 1610, a charge pump 1620 and a delay block 1630. The phase detector 1610 may accept two inputs, an externally-supplied clock signal $CLK_{ext}$ and a delayed version of the $CLK_{ext}$ signal (labeled $CLK_{del}$). Based on a detected difference between the two clock signals, the phase detector 1610 may generate a control signal to the charge pump 1620, causing it to raise or lower the voltage output therefrom. The output of the charge pump 1620 may be distributed to the monocycle generator and other circuits described above as a source of the $V_{dd}$ signal via a buffer 1640. The output of the charge pump 1620 may be filtered prior to being input to the buffer 1640 (box 1650).

The delay block 1630 may be a one-cycle delay element. In one embodiment, it may include a series of cascaded inverters (not shown) provided in sufficient number to delay the $CLK_{ext}$ signal a complete clock cycle. Thus, under ideal operating conditions and at steady state, the two clock signals would be identical to each other when input to the phase detector 1610. But, depending upon the process used to fabricate the skew controller 1600 or the temperature at which it operates, the delay imposed by the block 1630 may not be perfectly one cycle in duration. The phase detector 1610 and the charge pump 1620 may modify the output voltage ($V_{dd}$) in response to this skew. By modifying the output voltage, the phase detector 1610 and the charge pump 1620 may alter the switching delays imposed by transistors within the delay block 1630, thereby reducing and eventually eliminating the skew. Thus, the effects of process and temperature variations may be minimized by a skew controller 1600 as shown in FIG. 16.

When fabricated in an integrated circuit, the monocycle generator, the skew controller 1600 and the other circuit may be provided in the same integrated circuit (colloquially, "chip"). Thus, although manufacturing processes and operating temperatures can vary widely from chip to chip, these variables can be expected to be uniform within a chip. In an embodiment, the same types of transistors may be used throughout the skew controller 1600, the monocycle generator 100 and the other circuits. This structure helps to maintain the monocycle pulse width ($t_{pp}$) constant despite variations in process and operating temperature.

Although FIG. 16 illustrates an exemplary skew controller 1600 that may be used with the monocycle generator and other circuits shown hereinabove, their use is by no means restricted to systems that employ such a skew controller. Other methods and techniques are known in the art for regulating circuit performance in view of process and temperature variations; the monocycle generator and other circuits may be used with such techniques without restriction.

Indeed, the monocycle generator and other circuits, in some applications, may be used without such ameliorative techniques. A selection among these techniques may be determined by the applications for which the monocycle generator is to be used.

Many of the foregoing embodiments have described techniques that may be used to tailor response of the monocycle generator to communications applications. However, it should be remembered that the monocycle generators described hereinabove may find utility in other applications and are not so confined. To apply the monocycle generator to use with the synchronous oscillators or in radar applications, for example, it may be desirable to generate monocycle pulses having a predetermined orientation and timing. In such embodiments, rather than modulate timing relationships among the activation pulses, it may be preferred to apply activation pulses to the monocycle generators according to some predetermining timing scheme. Such applications also are envisioned for the monocycle generators described above.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A monocycle generator, comprising:
   a pair of transistors, a first transistor coupled to a first voltage source, a second transistor coupled to a second voltage source, both the first and second transistors coupled to a common output terminal,
   means for maintaining the output terminal at a voltage intermediate between the first and second voltages when the first and second transistors are non-conductive,
   a third transistor coupling the means to the first voltage source,
   a fourth transistor coupling the means to the second voltage source, and
   a second pair of transistors, one coupled to the first voltage source, another coupled to the second voltage source, both coupled to a second output terminal,
   wherein the means comprises a third pair of transistors bridging between the first and second output terminals and a reference potential coupled to a node between the third pair of transistors.

2. The monocycle generator of claim 1, wherein the means comprises a voltage divider.

3. The monocycle generator of claim 1, wherein the means comprises a voltage regulator.

4. The monocycle generator of claim 1, wherein inputs of the first and fourth transistors are coupled to a common signal source and the first and fourth transistors are of different device types.

5. The monocycle generator of claim 1, wherein inputs of the second and third transistors are coupled to a common signal source and the second and third transistors are of different device types.

6. The monocycle generator of claim 1, further comprising a down pulse generator coupled to an input of the first transistor, the down pulse generator comprising:
   a pair of pull up transistors each bridging an input of the first transistor to the first voltage source,
   an input of the first pull up transistor coupled to a first clock source,
   an input of the second pull up transistor coupled to a second clock source that is delayed and inverted with respect to first clock source,
   a first pull down transistor bridging the input of the first transistor to the second voltage source,
   a second pull down transistor bridging an input of the first pull down transistor to the second voltage source, an input of the second pull down transistor coupled to a third clock source that is delayed with respect to the first clock source,
   a gate having an input coupled to the first clock source, an output coupled to the input of the first pull down transistor and a control input coupled to the second clock source.

7. The monocycle generator of claim 1, further comprising an up pulse generator coupled to an input of the second transistor, the up pulse generator comprising:
   a pair of pull down transistors each bridging the input of the second transistor to the second voltage source,
   the first pull down transistor coupled to a first clock source,
   the second pull down transistor coupled to a second clock source that is delayed and inverted with respect to the first clock source,
   a first pull up transistor bridging the input of the second transistor to the second voltage source,
   a second pull up transistor bridging an input of the first pull up transistor to the second voltage source, an input of the second pull up transistor coupled to a third clock source that is delayed with respect to the first clock source,
   a gate having an input coupled to the first clock source, an output coupled to the input of the first pull up transistor and a control input coupled to the third clock source.

8. The monocycle generator of claim 1, wherein the first and second transistors are conductive in response to an active portion of an up pulse signal.

9. The monocycle generator of claim 1, wherein the first voltage source comprises:
   a delay block having an input for a clock signal,
   a phase detector having an input for the clock signal and a second input coupled to the delay block, and
   a charge pump coupled to the phase detector having an output coupled to the first and third transistors and to the delay block.

10. A monocycle generator, comprising:
    a pair of pull up transistors, each coupled to respective ones of first and second output terminals and to a first voltage source,
    a pair of pull down transistors, each coupled to respective ones of the first and second output terminals and to a second voltage source,
    a pair of transistors bridging between the first and second output terminals,
    a reference potential coupled to a node between the two bridging transistors,
    wherein the pair of transistors bridging between the first and second output terminals are made conductive when all of the pull up and pull down transistors are non-conductive, and are made non-conductive when any of the pull up and pull down transistors are conductive.

11. The monocycle generator of claim 10, wherein:
    the pull up transistor coupled to the first output terminal and the pull down transistor coupled to the second output terminal are conductive in response to a first set of activation pulses, the pull up transistor coupled to the second output terminal and the pull down transistor coupled to the first output terminal are conductive in response to a second set of activation pulses, and timing of the respective sets of activation pulse is modulated in response to an information signal.

* * * * *